United States Patent [19]
Amerasekera et al.

[11] Patent Number: 5,949,694
[45] Date of Patent: Sep. 7, 1999

[54] METHOD AND SYSTEM FOR EXTRACTING HIGH CURRENT PARASITIC BIPOLAR TRANSISTOR PARAMETERS OF AN MOS DEVICE DURING OVERVOLTAGE EVENTS

[75] Inventors: Ekanayake A. Amerasekera, Plano, Tex.; Sridhar Ramaswamy, Champaign, Ill.; Jerold A. Seitchik, Dallas, Tex.

[73] Assignee: Texas Instruments Incorporated, Dallas, Tex.

[21] Appl. No.: 08/845,534

[22] Filed: Apr. 25, 1997

Related U.S. Application Data

[60] Provisional application No. 60/017,064, Apr. 26, 1996.

[51] Int. Cl.$^6$ .................................................. G06F 17/50
[52] U.S. Cl. ........................... 364/578; 364/490; 257/360
[58] Field of Search ..................................... 364/578, 488, 364/489, 490, 491; 361/91, 56, 57; 437/50, 45; 257/362, 361, 360

[56] References Cited

U.S. PATENT DOCUMENTS

| | | | |
|---|---|---|---|
| 5,301,084 | 4/1994 | Miller | 361/91 |
| 5,404,041 | 4/1995 | Diaz et al. | 257/360 |
| 5,450,267 | 9/1995 | Diaz et al. | 361/56 |
| 5,468,667 | 11/1995 | Diaz et al. | 437/50 |
| 5,477,414 | 12/1995 | Li et al. | 361/56 |
| 5,623,387 | 4/1997 | Li et al. | 361/56 |
| 5,629,545 | 5/1997 | Leach | 257/362 |
| 5,637,892 | 6/1997 | Leach | 257/362 |
| 5,689,133 | 11/1997 | Li et al. | 257/361 |
| 5,710,689 | 1/1998 | Becerra et al. | 361/57 |
| 5,733,794 | 3/1998 | Gilbert et al. | 437/45 |
| 5,744,841 | 4/1998 | Gilbert et al. | 257/360 |

OTHER PUBLICATIONS

Anerasekera et al., Modeling Mos Snapback and Parasitic Bipolar Action for Circuit–Level ESD and High Current Simulations, Reliability Physics Symposium, 1996, 34th Annual Proceedings, IEEE, pp. 318–326.

Anerasekera et al., Modeling MOS Snapback and Parasitic Bipolar Action for Circuit–Level ESD and High Current Simulations, IEEE Circuits and Devices Magazine, Mar. 1997, vol. 132, pp. 7–10.

Chen et al., Design Methodology for Optimizing Gate Driven ESD Protection Circuits in Submicron CMOS Processes, Electrical Overstress/Electrostatic Discharge Symposium, 1997 Proceedings, pp. 230–239.

Chen et al., Design and Layout of a High ESD Performance NPN Structure for Submicron BiCMOS/Bipolar Circuits, Reliability Physics Symposium, 1996, 34th Annual Prceedings, IEEE, pp. 227–232.

Amerasekera et al., Characterization and Modeling of Second Breakdown in NMOST's for the Extraction of ESD–Related Process and Design Parameters, IEEE Transactions on Electron Devices, vol. 38, No. 9, Sep. 1991, pp. 2161–2168.

(List continued on next page.)

*Primary Examiner*—Kevin J. Teska
*Assistant Examiner*—Russell W. Frejd
*Attorney, Agent, or Firm*—Mark A. Valetti; Wade James Brady III; Richard L. Donaldson

[57] ABSTRACT

An embodiment of the instant invention is a method of optimizing an I/O circuit formed on a substrate with regards to an overvoltage or ESD event wherein the I/O circuit comprises at least one MOS device which has I–V characteristics, the method comprising the steps of: extracting selective electrical characteristics of the MOS device while the MOS device is operating in the avalanche and snapback regions of the I–V characteristics of the MOS device; characterizing the MOS device for the overvoltage or ESD event based on the electrical characteristics of the MOS device under standard operating conditions, the MOS device being comprised of a parasitic bipolar transistor and the substrate having a resistance; and wherein the I/O circuit is optimized for the overvoltage or ESD events by modifying the I/O circuit based on the electrical characteristics of the MOS device in conjunction with the characterization of the parasitic bipolar transistor and the substrate resistance.

7 Claims, 4 Drawing Sheets

OTHER PUBLICATIONS

Amerasekera et al., ESD Failure Modes: Characteristics, Mechanisms, and Process Influences, IEEE Transactions on Electron Devices, vol. 39, No. 2, Feb. 1992, pp. 430–436.

Chatterjee et al., Design and Simulation of a 4kV ESD Protection Circuit for a 0.8 μm BiCMOS Process, Electron Devices Meeting, 1991, IEEE, pp. 35.5.1–35.5.4.

Duvvury et al., ESD: A Pervasive Reliability Concern for IC Technologies, Proceedings of the IEEE, vol. 81, No. 5, May 1993, pp. 690–702.

Amerasekera et al., Prediction of ESD Robustness in a Process Using 2–D Device Simulations, Reliability Physics, 1993 IEEE 31st Annual Proceedings, pp. 161–167.

Amerasekera et al., The Impact of Technology Scaling on ESD Robustness and Protection Circuit Design, IEEE Transactions on Components, Packaging, and Manufacturing Technology–Part A, vol. 18, No. 2, Jun. 1995,pp. 314–320.

Chen et al., Bipolar SCR ESD Protection Circuit for High Speed Submicron Bipolar/BiCMOS Circuits, IEEE Electron Devices Meeting, 1995 Technical Digest, pp. 337–340.

Voldman et al., Mixed–Voltage Interface ESD Protection Circuits for advanced Microprocessors in Shallow Trench and LOCOS Isolation CMOS Technologies, IEEE Electron Devices Meeting, 1994, pp. 277–280.

METHOD AND SYSTEM FOR EXTRACTING HIGH CURRENT PARASITIC BIPOLAR TRANSISTOR PARAMETERS OF AN MOS DEVICE DURING OVERVOLTAGE EVENTS

This application claims priority under 35 USC §119(e)(1) of provisional application Ser. No. 60/017,064, filed Apr. 26, 1996.

FIELD OF THE INVENTION

The instant invention pertains to semiconductor device fabrication and processing and more specifically to a method of extracting parasitic bipolar transistor parameters of an MOS device during an overvoltage event.

BACKGROUND OF THE INVENTION

The current levels in Electrostatic Discharge (ESD) events are generally in excess of 1 amp for durations of between a few nanoseconds to 100 nanoseconds, and can cause severe damage in Integrated Circuits (ICs). The most sensitive areas of an IC are the devices which are directly connected to bondpads. In order to protect the input/output (I/O) buffers from the ESD stress, protection circuits which act as voltage clamps and current shunts are placed in parallel with the I/O circuits. The purpose of the ESD protection circuit is to turn on during the ESD event and clamp the voltage before the I/O buffer is damaged.

The design and optimization of ESD protection circuits is greatly enhanced by the ability to perform circuit level simulations of the protection circuits and the I/O buffers. Most available simulators do not address the high current region of the circuit operation, but still enable an approximate analysis to be made of the behavior under ESD conditions. The growing use of MOS-based protection circuits (rather than the SCR-type structures), and the integration of the protection circuits with the internal circuitry, lead to a need for simulators which are able to more accurately reproduce the behavior of the circuit under ESD conditions.

During an ESD event, the internal gates of the chip could be at different potentials depending on the coupling of the power supply bus to the ESD voltage. The turn on of the ESD protection circuit and its effectiveness becomes dependent on the turn on behavior of the I/O buffers and the state of the internal logic during the stress. Hence, it is an object of the instant invention to provide an ESD circuit simulator that includes the high current behavior of the MOS transistors under gate bias conditions. It also is an object of the instant invention to provide a simulator that simulates circuit operation during an Electrical Overstress (EOS) or overvoltage stress under power-up conditions to be determined.

Existing simulation methods use models which are impossible to practically implement in an MOS ESD simulator. This greatly reduces their effectiveness and their usage. Hence, it is an object of the instant invention to provide a simple and practical parameter extraction methodology which is essential for the application of the simulator.

It is, therefore, an object of the instant invention to provide a method for simulating the effects of an ESD-type stress on a full I/O circuit, and to identify the current paths and internal node voltages during the stress. It is also an object of the instant invention to provide a method for simulating the effects of a parasitic bipolar transistor in parallel with an MOS device so as to optimize I/O circuits with regards to normal operation and overvoltage events.

SUMMARY OF THE INVENTION

An embodiment of the instant invention is a method of optimizing an I/O circuit formed on a substrate with regards to an overvoltage or ESD event wherein the I/O circuit comprises at least one MOS device which has I-V characteristics, the method comprising the steps of: extracting selective electrical characteristics of the MOS device while the MOS device is operating in the avalanche and snapback regions of the I-V characteristics of the MOS device; characterizing the MOS device for the overvoltage or ESD event based on the electrical characteristics of the MOS device under standard operating conditions, the MOS device being comprised of a parasitic bipolar transistor and the substrate having a resistance; and wherein the I/O circuit is optimized for the overvoltage or ESD events by modifying the I/O circuit based on the electrical characteristics of the MOS device in conjunction with the characterization of the parasitic bipolar transistor and the substrate resistance.

BRIEF DESCRIPTION OF THE DRAWINGS

FIG. 2 illustrates the parasitic bipolar transistor that is present in an MOS device. FIG. 2 also illustrates the currents present in the NMOS device and the parasitic bipolar transistor.

FIG. 5 illustrates the current sources and resistance of the parasitic bipolar transistor.

DETAILED DESCRIPTION OF THE DRAWINGS

Figure 1:
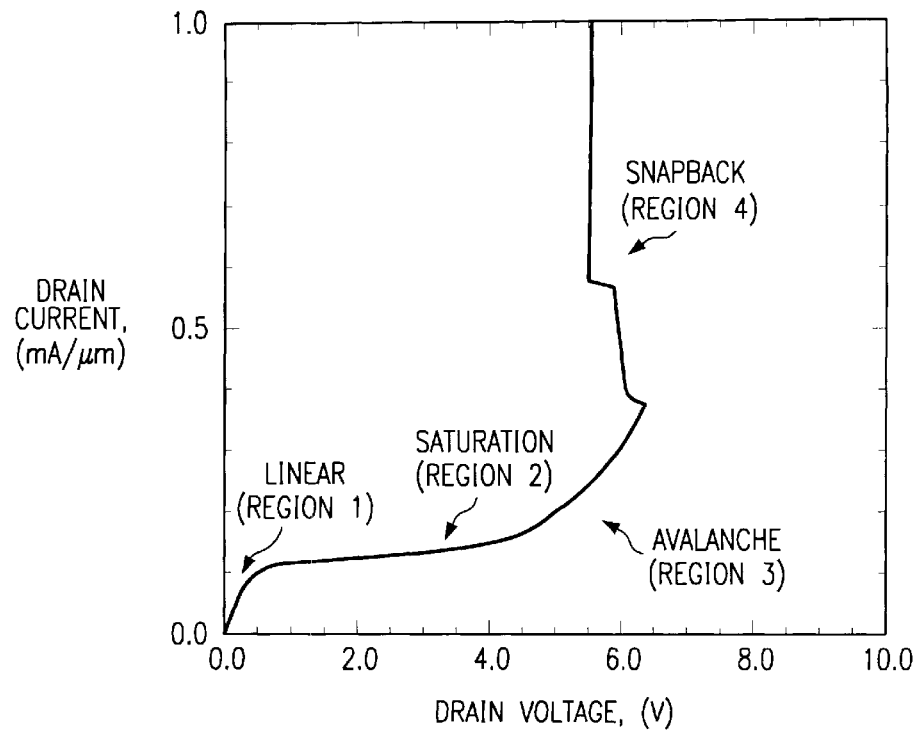
FIG. 1 is an I-V curve for an NMOS device which is under gate bias.

The current densities during ESD events are significantly higher than typical operating conditions for which MOS devices have been designed. The regions of the I–V curve are depicted schematically in FIG. 1. Region 1 is the linear region governed by standard MOS equations and properly modeled in most simulation programs. Region 2 is the saturation region, also governed by the standard MOS equations and properly modeled in most simulation programs. Region 3 is the avalanche breakdown region, and the standard MOS equations are no longer valid in this region. Region 4 is the bipolar, or snapback region, where the standard model equations do not extend. It is in the Regions 3 and 4 that the ESD/EOS operation takes place.

Figure 2:
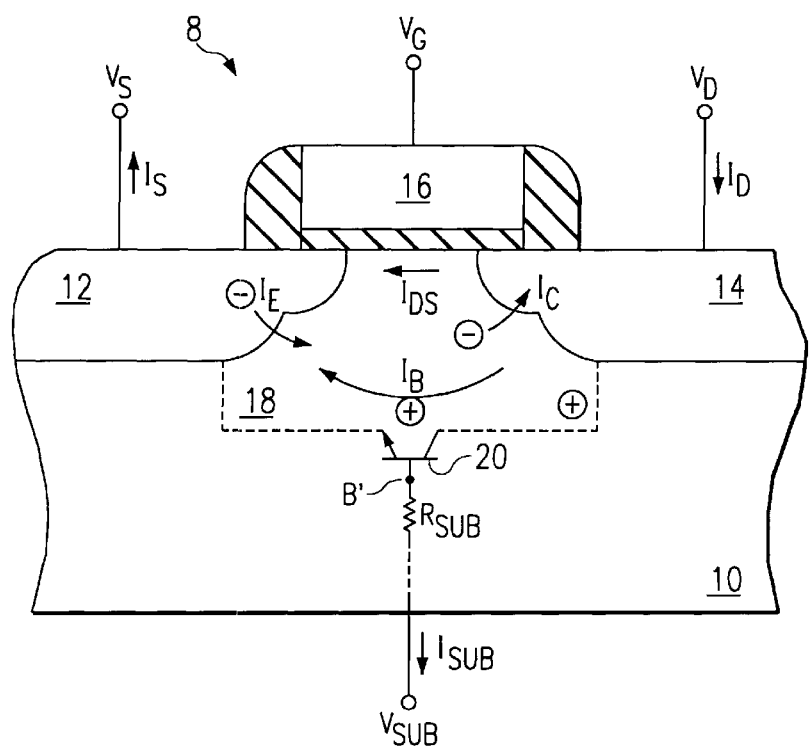
FIG. 2 is a cross sectional view of an NMOS device.

FIG. 2 shows a cross-section of an NMOS transistor indicating the currents during a high current stress. The avalanche generation of carriers in the high-field region near the drain results in hole current into the substrate $I_{sub}$. The voltage dropped across the substrate resistance $R_{sub}$ due to $I_{sub}$ raises the local substrate potential $V'_B$ and eventually causes the source-substrate junction to become forward biased. Electrons injected from source 12 into substrate 10 are collected at drain 14 thus forming lateral NPN bipolar transistor 20 with the drain as collector, the source as emitter and the substrate as the base. The effectiveness of this transistor is dependent on the emitter injection efficiency, γ, and the base transport factor, $\alpha_T$, which is dependent on the effective channel length, $L_{eff}$. It is important to note that the emitter area of the bipolar transistor is not the same as the diffusion area of the source, since only a small portion of the source is forward biased.

Simulation of the parasitic NPN transistor behavior under ESD conditions was first presented by Scott. The limitation of this model was the difficulty in accurately representing the parasitic bipolar transistor. Recent advances in developing the first ESD circuit simulators showed good correlation to measurement using standard Gummel-Poon (GP) bipolar models to describe the parasitic bipolar transistor. The problem with the GP models are the number of additional parameters required to define the bipolar transistor. This increases the number of measurements and complicates the device parameter set for the simulator. The extraction of the lateral bipolar parameters in a CMOS process is a further complication because a standard bipolar extraction methodology cannot be directly applied to the parasitic bipolar transistor.

The parasitic bipolar transistor operates under almost fixed bias conditions. Therefore, the complex parameter sets associated with the GP model are not required to reproduce the MOS high current behavior. Hence, it is an object of the instant invention to provide a simulation method that is based on the specific I-V curves which are to be reproduced, and the high current MOS I-V curves, which includes drain current ($I_D$), source current ($I_S$), and substrate terminal currents ($I_{sub}$).

In the NMOS transistor of FIG. 2, the voltage drop in the substrate is given by $$V'_B = I_{sub} \times R_{sub}.$$

As $V'_B$ approaches ≈0.7 V, the forward-biasing of the source-substrate junction will cause the parasitic bipolar to begin to turn on. The emitter current is given by $I_E$ and the collector current by $I_C$ with $I_B$ as the base-emitter current.

$I_{sub}$ is a function of the avalanche multiplication factor, M, in the high field region of the drain. The avalanche generation current at the high field region due to an incident current $I_F$ is given by $$I_{gen} = (M-1) \cdot I_P \qquad (1)$$

With $V_G$=0, the incident current at the drain junction is solely due to thermal generation and minority carrier diffusion. Before the bipolar turns on, $I_{gen} = I_{sub}$. A typical value of $I_{sub}$ for bipolar turn on in a thin epi sub-0.5 μm process is ≈200 μA/μm, while $I_p$ at room temperature can be as low as $10^{-19}$ A/μm. Thus M needs to be close to $10^{15}$ to provide the required $I_{sub}$ for bipolar action to begin (i.e. M goes to infinity as the drain voltage, $V_D$, approaches the avalanche breakdown voltage, $V_{av}$.

Figure 3:
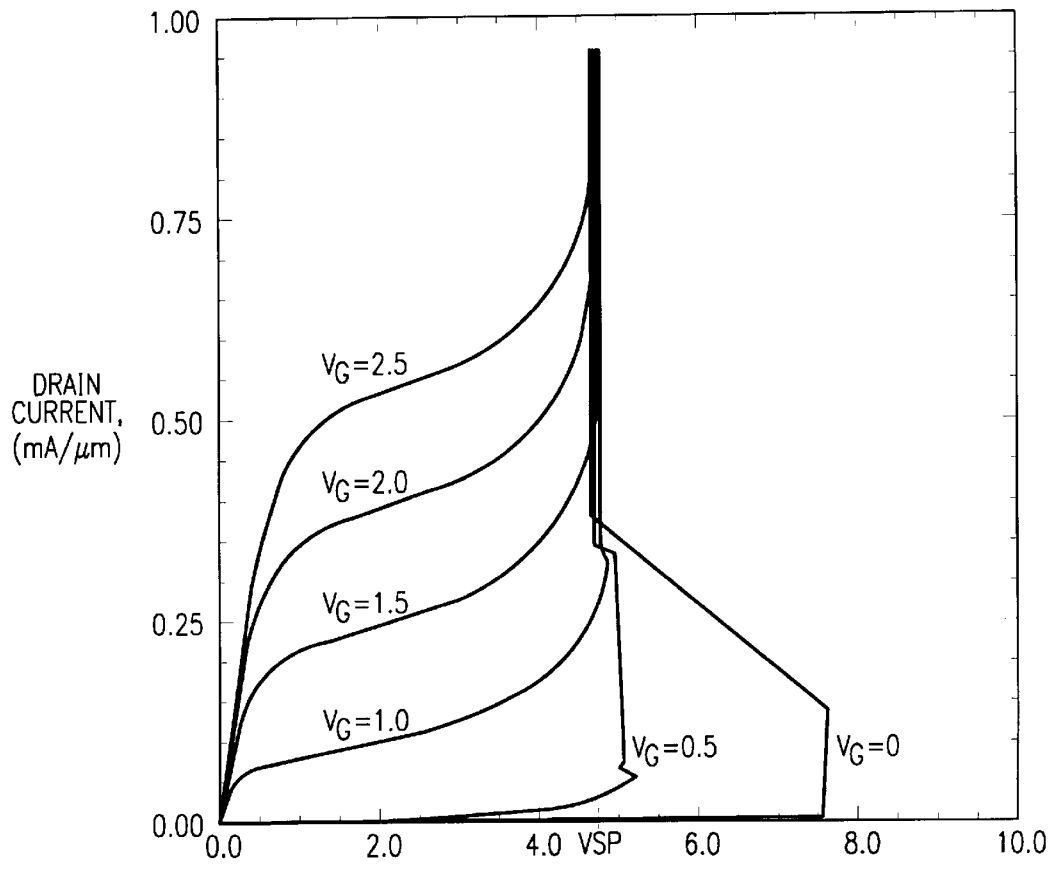
FIG. 3 is a high current I-V curve for an NMOS device.

A gate voltage, $V_G$, greater than the MOS threshold voltage, $V_{TH}$, will result in a MOS current between the drain and source, $I_{DS}$. $I_p$ will now be much larger, and a lower M can sustain the same $I_{sub}$. Hence, the drain voltage at which the bipolar turn on is initiated reduces as a function of $V_G$ as shown by the $I_D$ versus $V_D$ curves in FIG. 3.

As the bipolar turns on, the bipolar current, $I_C$, provides an additional current source for multiplication, further reducing the value of M required to sustain the bipolar in the on state. $V_D$ can reduce even more and voltage "snapback" (region 3 of FIG. 1) occurs, where $V_D$ drops to a sustaining level $V_{sp}$. The value of $V_{sp}$ is dependent on the value of $V_D$ required to maintain the $V_B$ at the level needed to sustain the bipolar current. Hence, $V_{sp}$, is a function of $R_{sub}$, M, and the gain of the intrinsic parasitic bipolar, transistor β.

Figure 4:
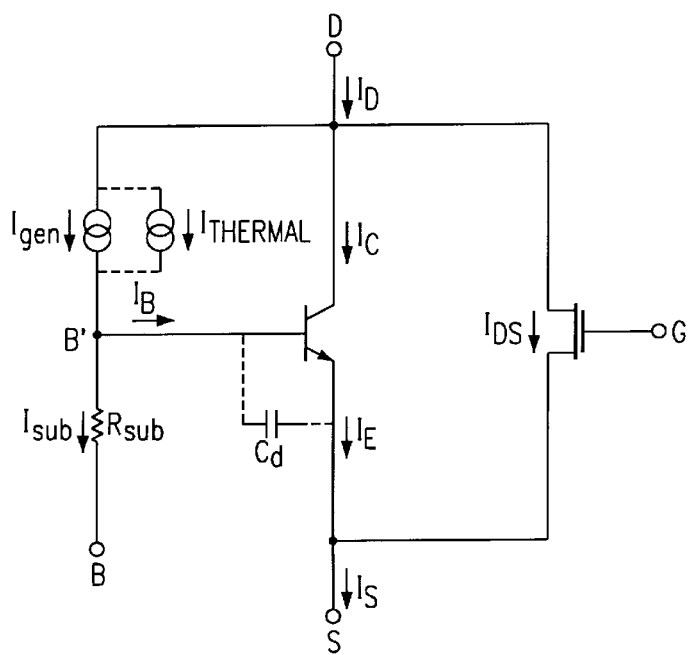
FIG. 4 is the equivalent circuit diagram of the instant invention for an MOS device.

FIG. 4 illustrates the equivalent circuit of MOS transistor 8 after bipolar transistor 20 turn on. The collector-base avalanche generation is represented by the current source $I_{gen}$, which provides the base-emitter current $I_B$ and the substrate current $I_{sub}$. The three terminal currents are $I_D$, $I_S$, and $I_{sub}$.

It is important to note that β of the parasitic bipolar transistor is different from the β of the lateral bipolar. As mentioned earlier, parasitic bipolar transistor 20 is formed by the sidewall regions of the source and drain junctions acting as emitter and collector. The voltage across the base-emitter junction, $V_{BE}$, is provided by the local substrate potential and the base current is usually provided by the internal current source due to avalanche generation at the drain junction. In contrast the lateral bipolar is biased through the substrate (base) contact, and $V_{BE}$ is provided externally. Such a device has a larger emitter area, most of which does not contribute to the bipolar transistor itself but will influence the measurement of parameters such as current gain and resistance.

The base-emitter current $I_B$ is given by $$I_B = I_{oe} \cdot \left[ \exp\frac{(V_{BE})}{V_T} - 1 \right], \qquad (2)$$

and the bipolar transistor collector current $I_C$ is given by $$I_C = I_{oc} \cdot \left[ \exp\left(\frac{V_{BE}}{V_T}\right) - \exp\left(\frac{V_{BC}}{V_T}\right) \right] \qquad (3)$$

where $I_{oc}$, is the reverse saturation current due to diffusion of holes in the emitter of bipolar transistor 20, and $I_{oc}$, is the reverse saturation current due to diffusion of electrons in the base of bipolar transistor 20. $V_T$=kT/q is the thermal voltage. Since $V_{BC}$ is less than zero volts, Equation (3) can be written as $$I_C \cong I_{oc} \cdot \exp\left(\frac{V_{BE}}{V_T}\right). \qquad (4)$$

For an NPN transistor, $I_{oc}$ is given by, $$I_{oc} = \frac{q n_i^2 A_E D_n}{N_B W_B}, \qquad (5)$$

where $n_i$ is the intrinsic concentration, $A_E$, is the effective emitter area, $D_n$ is the effective diffusion constant, $N_B$, is the doping in the base and $W_B$ is the base width. Typically, $n_i$=1.45×10$^{10}$ cm-3, $A_E$ is given by the sidewall junction area, $D_n = V_T \times \mu_n$ and $w_B$ is the channel length of the device. For a 0.35 μm nMOS transistor, $I_{oc}$ is of the order of $10^{-19}$ A.

Similarly, $I_{oc}$ for an NPN transistor is given by $$I_{oe} = \frac{q n_i^2 A_E D_p}{N_B L_{pE}}, \qquad (6)$$

where $D_p$ is the effective diffusion constant for holes in the emitter, $N_E$ is the emitter doping concentration and $L_{pE}$ is the hole diffusion length in the emitter. In shallow junction silicided processes, $L_{pE}$ will be larger than the effective junction $X_{jeff}$, and $X_{jeff}$ should be used instead. Values of $I_{oc}$ are of the order of $10^{-20}$ A.

The current gain, $\beta$, of bipolar transistor 20 is given by $$\beta = \frac{I_C}{I_B}, \quad (7)$$

and from Equations (4) and (2), $$\beta = \frac{I_{oc}}{I_{oe}}. \quad (8)$$

Typical values of $\beta$ for the high current region as extracted from device simulations are between 5 and 10, as expected from the calculated values for $I_{oc}$ and $I_{oe}$. Since $\beta$, the emitter efficiency ($\gamma$), and the base transport factor ($\alpha_T$), are related through $$\beta = \frac{\gamma \cdot \alpha_T}{1 - \gamma \cdot \alpha_T}, \quad (9)$$

the parameters $I_{oc}$ and $I_{oe}$ also define $\gamma$ and $\alpha_T$. In sub-0.5 $\mu$m MOS transistors, $\alpha_T \approx 1$, and $\beta$ is directly related to the emitter injection efficiency $\gamma$.

When the bipolar transistor turns on, Equation (1) can be rewritten as, $$I_{gen} = (M-1) \cdot (I_{DS} + I_C), \quad (10)$$

where $I_{DS}$ is the drain-source current due to MOS action, while $I_C$ is the collector-emitter current due to bipolar action. $I_{DS}$ for a given $V_G$ is determined by the standard MOS equations.

Part of the generated holes will form the base-emitter current, $I_B$, and the rest will provide the substrate current, thus $$I_{gen} = I_{sub} + I_B, \quad (11)$$

where $I_B$ is given by Equation (2). Therefore, $$I_{sub} = (M-1) \cdot (I_{DS} + I_C) - I_B. \quad (12)$$

Once the bipolar transistor is fully turned on, $V_G$ dependence becomes negligible if $I_C$ is much larger than $I_{DS}$, which is the case under high injection conditions.

The multiplication factor, M, can be described in terms of the impact ionization coefficient, $\alpha$, by $$M = \frac{1}{1 - \int_0^{\chi_d} \alpha \, d\chi}, \quad (13)$$

where $\chi_d$ is the width of the depletion region. The impact ionization coefficient, $\alpha$, is given by, $$\alpha = A \cdot \exp\left(-\frac{B}{E}\right), \quad (14)$$

where A and B are constants and E is the electric field in the high field region. E will vary across the depletion region for weak avalanche. However, for strong avalanche, as in the case of snapback, E could be assumed to be constant over the depletion width and M can be written as $$M = \frac{1}{1 - \alpha \chi_d}, \quad (15)$$

Empirically, M can be described in the form $$M = \frac{1}{1 - (V_D / V_{av})^n}, \quad (16)$$

where $V_D$ is the applied (drain) voltage, $V_{av}$ is the avalanche breakdown voltage, and n is a fitting parameter ranging from 2 to 6 depending on the type of junction being considered. This equation does not take into account the effect of $V_G$ on the electric field at the drain junction under MOS conditions. It is, therefore, better to combine Equations (14) and (15) to give, $$M = \frac{1}{1 - K1 \cdot \exp[-K2/(V_D - V_{dsat})]}. \quad (17)$$

Here K1 and K2 are fitting parameters where $K1 \sim A \cdot \chi_d$ and $K2 \sim B \cdot \chi_d$. The voltage across the high field region of width $\chi_d$ is given by $(V_D - V_{dsat})$. The effect of $V_G$ on the drain electric field is included through the drain/source saturation voltage $V_{dsat}$ given by $$V_{dsat} = \frac{V_G - V_{TH}}{a_1 + b_1(V_G - V_{TH})}, \quad (18)$$

where $V_{TH}$ is the threshold voltage of the MOS transistor and $a_1$ and $b_1$ are parameters which are used in the standard MOS model. The $b_1$ term is dependent on the channel length. For $V_G = 0$ V, as $V_D$ approaches $V_{av}$, M approaches infinity, and Equation (17) can be rewritten as $$V_{av} = \frac{K2}{\ln(K1)}. \quad (19)$$

This equation can be used to verify K1 or K2 if $V_{av}$ is already extracted.

$R_{sub}$ has an important role in the biasing of the bipolar transistor. Now, $V_{BE} = I_{sub} \cdot R_{sub}$, and $I_C$ is a function of $\exp(V_{BE}/V_T)$, so small changes in $V_{BE}$ will have a big influence on $I_C$. However, $I_C$ is also dependent on $I_{oc}$, which can be used as a fitting parameter to compensate for inaccuracies in $R_{sub}$ that may arise due to conductivity modulation in the substrate etc. Hence, as a starting point, $R_{sub}$ can be calculated from a simple approximation $$R_{sub} = V_{BE}/I_{sub}, \quad (20)$$

and $V_{BE}$ is taken to be 0.8 V at the snapback point. $I_{sub}$ is a measured value, and since $V_{BE}$ is typically between 0.7 and 0.9 V, the error in calculating $R_{sub}$ could be about 10%. Other approaches which calculate the spreading resistance or obtain empirical relationships for $R_{sub}$ may be used for more accuracy if deemed necessary. For a p-well sheet resistance of $\approx 2000$ $\Omega$/sq., a gate length of 0.5 $\mu$m, and W=20 $\mu$m, measurements give $R_{sub} \approx 300$ $\Omega$.

Figure 5:
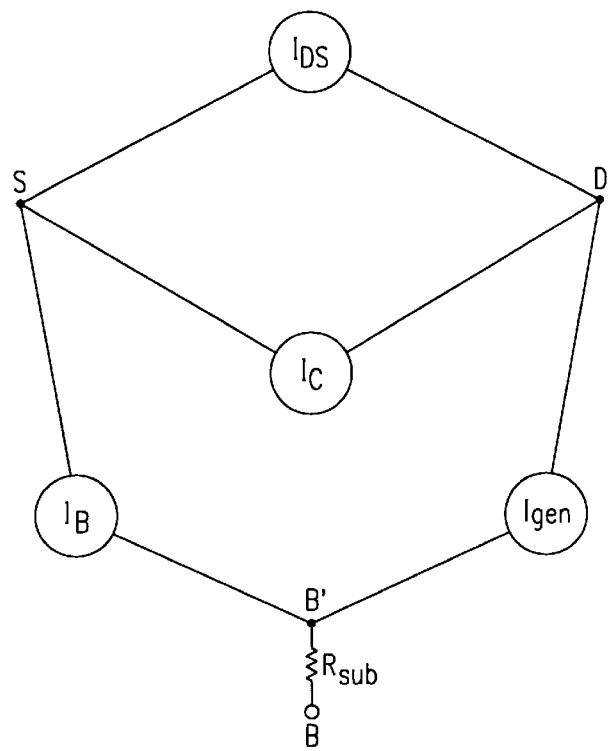
FIG. 5 is a circuit diagram of the instant invention.

One embodiment of the instant invention is a method of simulating the parasitic bipolar transistor of an MOS device during overvoltage conditions. The equation set for this method of simulating "snapback" are described by the current sources shown in FIG. 5 and the extra resistor $R_{sub}$.

These equations are listed below (specifically, equations (21)–(25)). The equivalent circuit of the bipolar transistor as implemented in the instant invention, together with the MOS transistor, is shown in FIG. 4.

Collector current, $I_C$, can be determined by the following equation, where $I_{oc}$ is the collector reverse saturation current $$I_C = I_{oc} \cdot \left[ \exp\left(\frac{V_{BE}}{V_T}\right) - \exp\left(\frac{V_{BC}}{V_T}\right) \right]. \quad (21)$$

Multiplication Factor, M, can be calculated by $$M = \frac{1}{1 - K1 \cdot \exp[-K2/(V_D - V_{dsat})]}. \quad (22)$$

Generation current, $I_{gen}$, can be calculated by $$I_{gen} = (M-1) \cdot (I_{DS} + I_C) \quad (23)$$

where $I_{DS}$ is the MOS current obtained from any standard equations.

Intrinsic base current, $I_B$, can be calculated by $$I_B = I_{oe} \cdot \left[ \exp\left(\frac{V_{BE}}{V_T}\right) - 1 \right] \quad (24)$$

Substrate Resistance, $R_{sub}$, can be determined by $$R_{sub} = 0.8/I_{sub} \quad (25)$$

with $I_{sub}$ measured at the snapback point.

As $V'_B$ increases, the increased body effect will lower the $V_{TH}$ and $I_{DS}$ will increase. This effect can be incorporated into the high current simulation by including $V'_B$ as part of the substrate voltage $V_B$.

Figure 6:
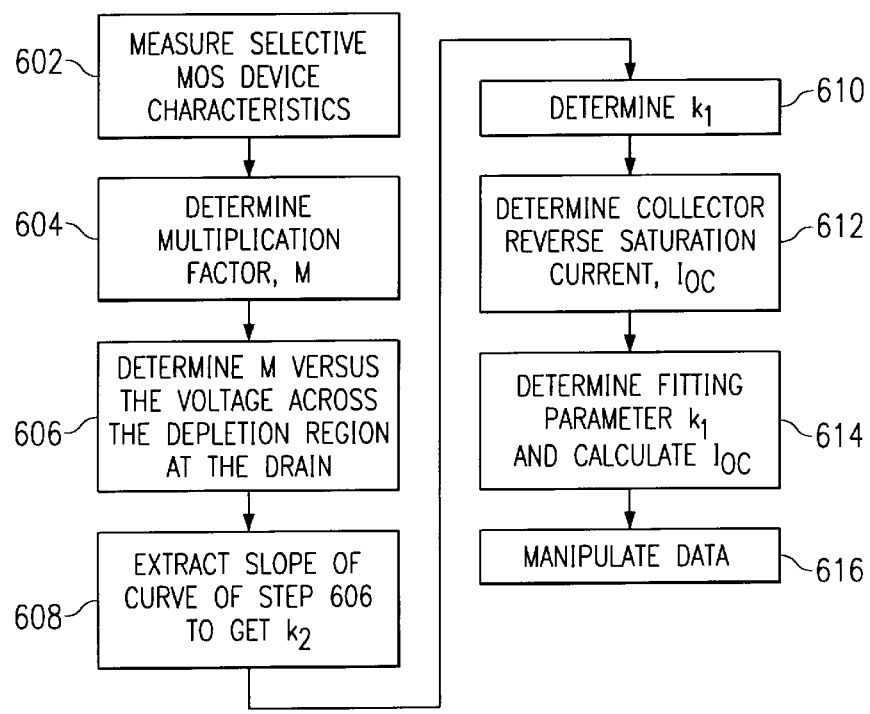
FIG. 6 is a flow diagram of the method of the instant invention.

FIG. 6 is a flow diagram of the method of the instant invention. Referring to step 602, a single I-V measurement is made for a stand-alone NMOS (or PMOS) transistors with different channel lengths. For this step, a current source is applied to the drain for varying $V_G$. This is the only measurement required. However, additional measurements, such as substrate resistance measurements and avalanche breakdown voltage measurements can be added, but those parameters can be extracted for a given process anyway.

Next, the M factor is determined in step 604. The M factor is an important parameter to be extracted in addition to the standard MOS model parameters. M is determined in the region before bipolar turn on takes place. Since substantially all of the generation current appears as substrate current before bipolar transistor turn on, $$M = \frac{I_D}{I_D - I_{sub}}. \quad (26)$$

After the bipolar transistor turns on, some of the generation current will flow into the emitter, and M cannot be extracted from measurements after snapback. Since M begins to decrease after the bipolar transistor turns on, the peak value of M, as obtained by plotting Equation (26) as a function of $V_D$, will indicate when the parasitic bipolar transistor begins to turn on. Rearranging Equation (17) gives $$1 - \frac{1}{M} = K1 \cdot \exp\left(\frac{-K2}{V_D - V_{dsat}}\right). \quad (27)$$

Figure 7:
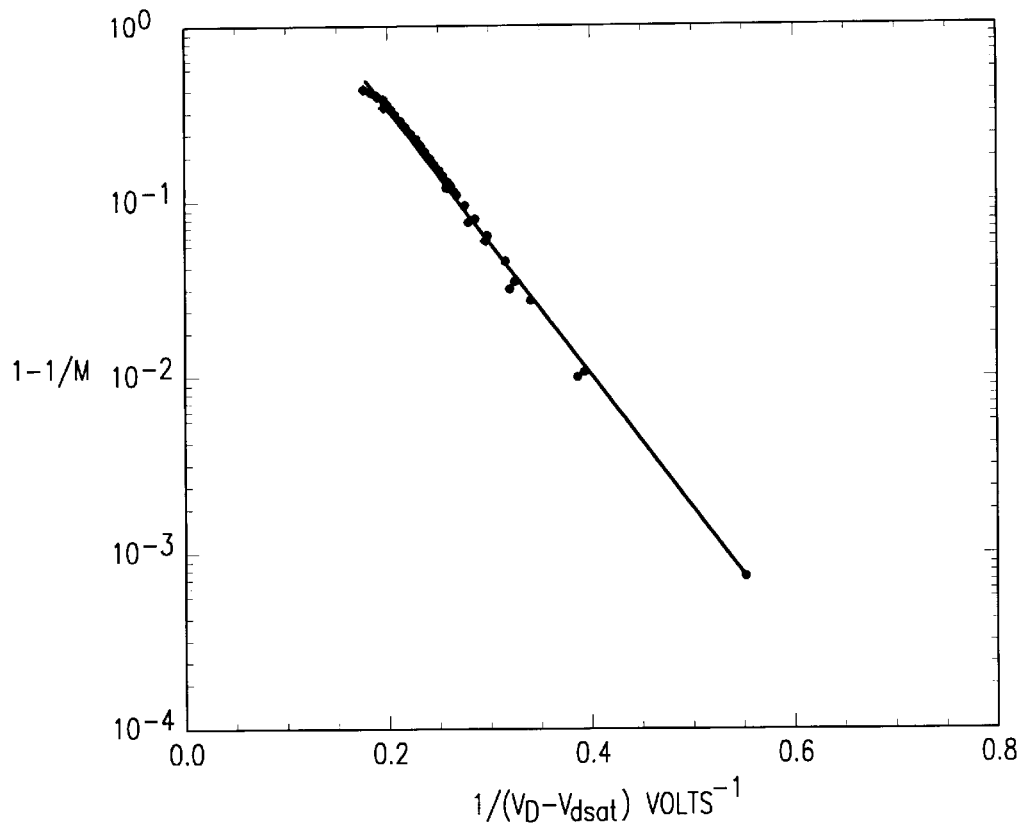
FIG. 7 is a plot of (1−1/M) versus $1/(V_D-V_{dsat})$. Note, the vertical axis is on a logarithmic scale.

Referring to step 606, $V_{dsat}$ can be determined in using standard model extraction described by Equation (18). Hence, a plot of $\ln(1-1/M)$ as a function of $1/(V_D-V_{dsat})$ provides the parameters K1 and K2 from the intercept and the slope, respectively. FIG. 7 illustrates a plot of experimental data taken for extracting M. The solid line is the fit of Equation (27) to this data.

Referring to step 608, the intercept of the log-linear curve can vary by up to 50% without affecting the fit significantly, which can lead to an error in K1. To improve the fit for K1, it is better to obtain K2 from the slope of the curve and then to use the measured value of $V_{av}$, together with Equation (19) to determine K1 (step 610).

$$K1 = \exp\left(\frac{K2}{V_{au}}\right). \quad (28)$$

This type of determination will ensure that the correct avalanche voltage is obtained for simulations with $V_G=0$.

Next, in steps 612 and 614, $I_{oc}$ can be determined from Equation (3) and $I_{oe}$ from Equation (2). Essentially, $I_{oc}$ and $I_{oe}$ will determine the bipolar transistor current for a specific M and $V_{BE}$, and will be used to tune the high current I-V curve to measured data.

From Equation (3), $$I_{oc} = \frac{I_C}{\exp(V_{BE}/V_T)}, \quad (29)$$

and since $V_{BE} = I_{sub} \cdot R_{sub}$, $$I_{oc} = \frac{I_C}{\exp(I_{sub} \cdot R_{sub}/V_T)} \quad (30)$$

Now, at the drain junction, $$I_C = \frac{I_D}{M} - I_{DS}, \quad (31)$$

where $I_{DS}$ is the MOS current which is either determined from a standard MOS model or by measurement. Substituting for $I_C$, $$I_{oc} = \frac{I_D/M - I_{DS}}{\exp(I_{sub}R_{sub}/V_T)}, \quad (32)$$

$I_{oc}$ is obtained from the vertical portion of the I-V curve. Similarly, a direct extraction of $I_{oe}$ is possible (step 614) using Equations (2) and (21) which give, $$I_{oe} = \frac{(M-1)I_D/M - I_{sub}}{\exp(I_{sub}R_{sub}/V_T)}. \quad (33)$$

However, it is preferable to use $I_{oe}$ as a fitting parameter for accurately matching the snapback holding voltage. The condition for the snapback holding point can be shown to be $$\beta \cdot (M-1) = k, \quad (34)$$

where k is a fitting parameter which is optimized for matching the snapback voltage and has a value between one and two, inclusive. Substituting for β from Equation (8), $I_{oe}$ can be written as $$I_{oe} = I_{oc} \cdot (M-1)/k. \tag{35}$$

Using the high current section of the I-V curve, M is determined from Equation (22) for the value of $V_D$ with $V_{dsat}=0$, thus giving $I_{oe}$.

Referring to step 616, after the values for $I_{DS}$, $I_C$, $I_B$, $I_{SUB}$, and $R_{SUB}$ are extracted/calculated/derived, these values are substituted into the model of FIG. 4, along with the MOS device parameters, and a model for the MOS device in conjunction with the parasitic bipolar transistor is completed. With this model, the entire I-V characteristics of the MOS device in conjunction with the parasitic bipolar transistor can be determined.

An advantage of the methodology of the instant invention is that it allows the measured I-V curve to be accurately simulated by making all the bipolar transistor parameters interdependent. The introduction of $I_B$ is a key factor in making this set of model equations workable. Previous approaches evaluated $I_C$ using Equation (3) with $V_{BE}$ equal to $V'_B$ and was effectively a fitting parameter and $R_{sub}$ equal to infinity. The problem with that approach is that $I_{oc}$ is required to be dependent on $I_{sub}$ to accommodate any actual changes in $R_{sub}$ and the intrinsic β. In the instant invention, $I_B$ closes the loop on the equation set and makes all the parameters interdependent thus ensuring self-consistency. $I_{oe}$ determines what percentage of the generated current is required to maintain the source-substrate potential at the necessary $V_{BE}$. It also defines the snapback holding voltage through Equation (35). Since $I_{oe}$ is determined from measured M and the calculated $I_{oe}$, it ensures that the snapback holding voltage is accurate for the device being measured.

The above description has focused on a non-thermal model because the principal current and voltage effects in a circuit, before the failure point is reached, can be adequately defined by isothermal simulation. Extending the models to include thermal effects requires the addition of a heat source, and a thermal current source (FIG. 4, $I_{THERMAL}$). The high current electrothermal behavior of the lateral NPN close to the thermal failure point is defined by the thermally generated current, and the temperature dependence of the avalanche generated current. Thermal generation can, therefore, be incorporated in this model by including a second current source in parallel with the avalanche generation source shown in FIG. 4.

The method of the instant invention as described above does not include the time-dependent turn on of the bipolar transistor, which is defined by the base transit time τ. Since the bipolar transistor turn on time is less than 250 ps for L less than or equal to 1 μm, and the risetimes for Human Body Model (HBM) and Machine Model ESD stress is on the order of 5 ns, τ is not an issue for these cases. However, the Charged Device Model (CDM) test method has risetimes which can be greater than 250 ps, and for simulating CDM events, τ must be comprehended. This is accomplished through the addition of an effective diffusion capacitance $C_d$ (FIG. 4) between the base and emitter of the bipolar, where $C_d$ is a function of τ and the base charge $Q_b$.

Figure 8:
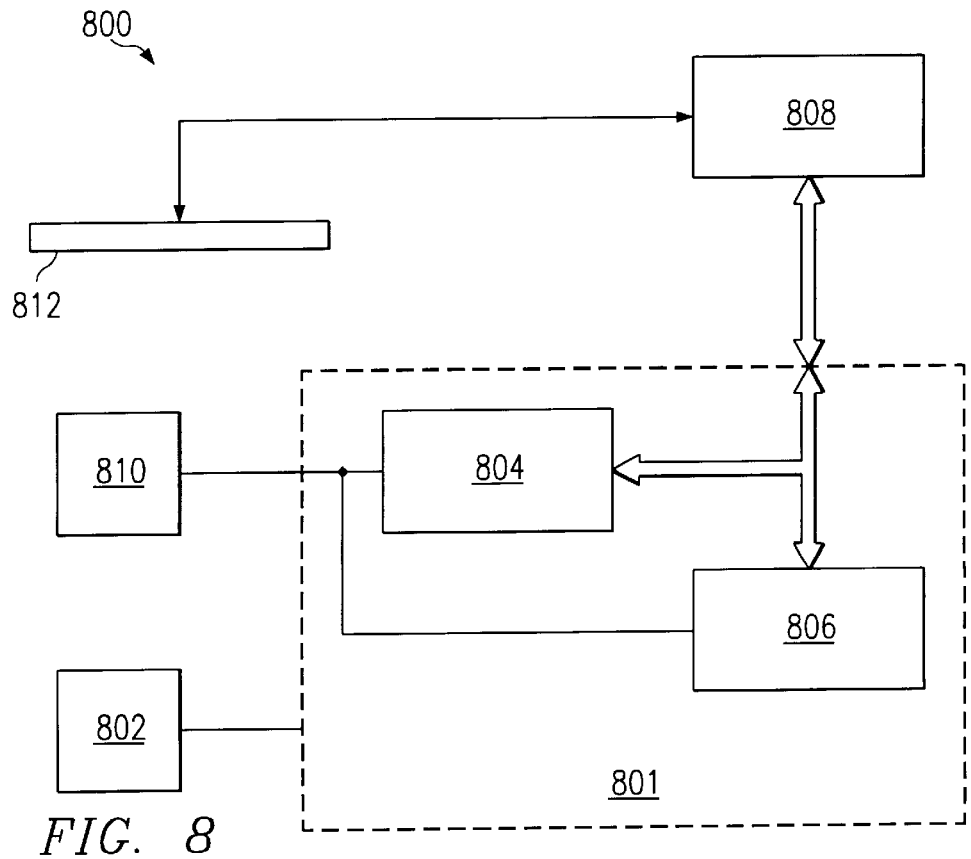
FIG. 8 is a block diagram illustrating the computer system of one embodiment of the instant invention.

FIG. 8 illustrates optimization/measurement system 800 of the instant invention. Measurement system 800 includes semiconductor wafer 810 which is populated with MOS devices. While FIG. 8 specifically shows wafer 810, the MOS devices do not have to be on a wafer, they may already be cut into individual devices. Block 808 represents measurement equipment and sensors which are used for extracting the MOS device characteristics. This information is manipulated by computer system 801 along with user input information (from input device 810—such as a keyboard or other input devices). Computer system 801 is comprised of processor 806 and memory 804. Once the information is manipulated it is displayed on display device 802 (e.g. a monitor or a printer). The manipulated information is then used to optimize the MOS device so that the MOS device performance in overvoltage and ESD events is acceptable.

More precisely, the instant invention is utilized to optimize an I/O circuit so that it performs adequately during an overvoltage event or an ESD event. Therefore, the instant invention is utilized to model the MOS device(s), which include the parasitic bipolar transistor as described above, which form the I/O circuit, and to either modify the MOS device(s) or alter the number or layout of the devices that make the I/O circuit so that the I/O circuit adequately performs during an ESD event or an overvoltage event and during standard operating conditions. Adequate performance of the I/O circuit may mean that it adequately protects other circuitry which is connected to the I/O circuitry during an ESD event.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of optimizing an I/O circuit formed on a substrate with regard to an overvoltage or ESD event wherein said I/O circuit comprises at least one MOS device which has I-V characteristics, said method comprising the steps of:

providing said substrate having a resistance;

providing on said substrate said MOS device having I-V characteristics including a linear region, a saturation region, an avalanche region and a snapback region and comprising a parasitic bipolar transistor;

extracting selective electrical characteristics of said MOS device while said MOS device is operating in the avalanche and snapback regions of said I-characteristics of said MOS device;

characterizing said MOS device for said overvoltage or ESD event based on said electrical characteristics of said MOS device under standard operating conditions;

optimizing said I/O circuit for said overvoltage or ESD events by modifying said I/O circuit based on the electrical characteristics of said MOS device in conjunction with said characterization of said parasitic bipolar transistor and said substrate resistance.

2. A method of optimizing an I/O circuit formed on a substrate with regard to an overvoltage or ESD event wherein said I/O circuit comprises at least one MOS device which has I-V characteristics, said method comprising the steps of:

extracting selective electrical characteristics of said MOS device while said MOS device is operating in the avalanche and snapback regions of said I-V characteristics of said MOS device;

characterizing said MOS device for said overvoltage or ESD event based on said electrical characteristics of said MOS device under standard operating conditions, said MOS device being comprised of a parasitic bipolar transistor and said substrate having a resistance;

said I/O circuit being optimized for said overvoltage or ESD events by modifying said I/O circuit based on the electrical characteristics of said MOS device in conjunction with said characterization of said parasitic bipolar transistor and said substrate resistance;

said step of characterizing said MOS device for an overvoltage or ESD event being comprised of modeling said MOS device and said parasitic bipolar transistor by a substrate resistor, an $I_{DS}$ current source situated between the source and drain of said MOS device, an $I_C$ current source situated between the source and drain of said MOS device, an $I_B$ current source situated between the source of said MOS device and said substrate resistor, and an $I_{gen}$ current source situated between the drain of said MOS device and said substrate resistor.

3. The method of claim 2, wherein characteristics of said $I_{DS}$ current source are determined by said extracted electrical characteristics of said MOS device.

4. The method of claim 2, wherein said substrate resistor is determined by $$R_{sub} = 0.8/I_{sub}$$

where $I_{sub}$ is measured at said snapback region.

5. The method of claim 4, wherein characteristics of said $I_C$ current source is given by $$I_C = I_{oc} \cdot \left[ \exp\left(\frac{V_{BE}}{V_T}\right) - \exp\left(\frac{V_{BC}}{V_T}\right) \right].$$

where $V_{BE}$ is the voltage between the base and the emitter of the parasitic bipolar transistor, $V_{BC}$ is the voltage between the base and the collector of the parasitic bipolar transistor, $V_T$ is the thermal voltage and $I_{oc}$ is the collector reverse saturation current which is given by $$I_{oc} = \frac{I_D/M - I_{DS}}{\exp(I_{sub}R_{sub}/V_T)},$$

where M is a multiplication factor which is given by $$M = \frac{1}{1 - K1 \cdot \exp[-K2/(V_D - V_{dsat})]}.$$

here $V_{dsat}$ is the drain-source saturation voltage and K1 and K2 are constants.

6. The method of claim 5, wherein characteristics of $I_B$ current source are determined by $$I_B = I_{oe} \cdot \left[ \exp\left(\frac{V_{BE}}{V_T}\right) - 1 \right]$$

where $I_{oe}$ is determined by $$I_{oe} = I_{oc} \cdot (M-1)/k.$$

where k is a fitting parameter which has a value between one and two, inclusive, and M is said multiplication factor.

7. The method of claim 6, wherein characteristics of said $I_{gen}$ current source are given by $$I_{gen} = (M-1) \cdot (I_{DS} + I_C)$$

where M is said multiplication factor.

* * * * *